United States Patent
Sun et al.

(10) Patent No.: US 11,647,659 B2
(45) Date of Patent: May 9, 2023

(54) ORGANIC LIGHT EMITTING DIODE DISPLAY AND ELECTRONIC DEVICE

(71) Applicant: Wuhan China Star Optoelectronics Semiconductor Display Technology Co., Ltd., Wuhan (CN)

(72) Inventors: Liang Sun, Wuhan (CN); Mian Zeng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/496,419

(22) PCT Filed: May 5, 2019

(86) PCT No.: PCT/CN2019/086940
§ 371 (c)(1),
(2) Date: Sep. 21, 2019

(87) PCT Pub. No.: WO2020/191887
PCT Pub. Date: Oct. 1, 2020

(65) Prior Publication Data
US 2022/0052117 A1 Feb. 17, 2022

(30) Foreign Application Priority Data
Mar. 26, 2019 (CN) .......................... 201910231670.7

(51) Int. Cl.
*H01L 27/32* (2006.01)
*H01L 51/52* (2006.01)

(52) U.S. Cl.
CPC ........ *H01L 27/322* (2013.01); *H01L 27/3218* (2013.01); *H01L 27/3234* (2013.01); *H01L 27/3244* (2013.01); *H01L 51/5237* (2013.01); *H01L 51/5265* (2013.01)

(58) Field of Classification Search
None
See application file for complete search history.

(56) References Cited

U.S. PATENT DOCUMENTS

| 2014/0252336 A1 | 9/2014 | Kobayashi |
| 2016/0043336 A1* | 2/2016 | Kim ...................... H01L 27/323 257/40 |
| 2016/0260785 A1* | 9/2016 | Jiao ...................... H01L 27/3246 |
| 2019/0207164 A1 | 7/2019 | Fang et al. |

(Continued)

FOREIGN PATENT DOCUMENTS

| CN | 102104057 A | 6/2011 |
| CN | 105353533 A | 2/2016 |

(Continued)

*Primary Examiner* — Nishath Yasmeen
(74) *Attorney, Agent, or Firm* — PV IP PC; Wei Te Chung; Ude Lu

(57) ABSTRACT

An organic light emitting diode (OLED) display panel and an electronic device. The display panel includes a substrate and a transparent display area disposed on the substrate, the transparent display area comprises a plurality of pixel units and a plurality of transparent units disposed at intervals. Each of the pixel units includes a light emitting structure and a filter disposed on the light emitting structure, a color of a light retained by the filter is same as a color of a light emitted by the light emitting structure

10 Claims, 1 Drawing Sheet

(56) References Cited

U.S. PATENT DOCUMENTS

| | | | |
|---|---|---|---|
| 2019/0214601 A1* | 7/2019 | Park | H01L 27/3246 |
| 2020/0144344 A1 | 5/2020 | Wang et al. | |
| 2020/0328373 A1* | 10/2020 | Huang | H01L 27/1218 |

FOREIGN PATENT DOCUMENTS

| | | | | |
|---|---|---|---|---|
| CN | 107293564 A | 10/2017 | | |
| CN | 207338380 U | 5/2018 | | |
| CN | 108198839 A | 6/2018 | | |
| CN | 108493211 A | 9/2018 | | |
| CN | 109411522 A | 3/2019 | | |
| KR | 20180061902 A | 6/2018 | | |
| WO | WO-2019019656 A1 * | 1/2019 | | H01L 27/1218 |

* cited by examiner

ORGANIC LIGHT EMITTING DIODE DISPLAY AND ELECTRONIC DEVICE

CROSS REFERENCE TO RELATED APPLICATION

This application claims the priority of International Application No. PCT/CN2019/086940, filed on 2019 May 15, which claims priority to Chinese Application No. 201910231670.7, filed on 2019 Mar. 26. The entire disclosures of each of the above applications are incorporated herein by reference.

BACKGROUND OF INVENTION

Field of Invention

The present invention relates to the field of display technologies, and in particular, to an organic light emitting diode (OLED) display and electronic device.

Description of Prior Art

In the prior art, a surface of an organic light emitting diode (OLED) display panel has a large amount of metal, and reflection of an external light of the metal will affect display effect of the OLED display panel. In order to reduce influence of the reflected light, one method provides a polarizer on a light emitting surface of the OLED display panel. The principle of the method is that light incident from the light emitting surface of the OLED display panel is converted into a left-handed (or right-handed) polarized light by the polarizer, and the left-handed (or right-handed) polarized light is reflected to be a right-handed (or left-handed) polarized light by the metal layer of the OLED display device. Because the reflected light is opposite to the polarization direction of the incident light, the right-handed (or left-handed) polarized light cannot be transmitted through the left-handed (or right-handed) polarizer, thereby eliminating the reflection of natural light on the OLED display device.

Technical Problem

The light transmittance of the existing polarizer is only about 42% to 44%, when eliminating reflection, the light transparent effect of the display panel is seriously affected. In the latest display panels, light sensors are usually integrated under the display panel, and the reduction in light transparent effect can seriously affect these light sensors.

SUMMARY OF INVENTION

The present invention provides an organic light emitting diode (OLED) display panel and an electronic device, which can reduce the light transparent of the display panel while reducing the reflection of the display panel.

In order to solve the above problems, the present invention provides an OLED display panel, wherein the display panel comprises a substrate and a transparent display area disposed on the substrate, the transparent display area comprises a plurality of pixel units and a plurality of transparent units disposed at intervals;

wherein each of the pixel units comprises a light emitting structure and a filter disposed on the light emitting structure, a color of a light retained by the filter is same as a color of a light emitted by the light emitting structure;

wherein the light emitting structure comprises thin film transistors and a light emitting layer corresponding to the thin film transistors;

wherein each of the transparent units comprises a transparent laminate, the transparent laminate formed by extending transparent insulating layers in the light emitting structure adjacent to the transparent unit, the transparent insulating layers comprise insulating layers in the thin film transistor and the light emitting unit.

According to one aspect of the invention, wherein the display panel further comprises an encapsulation structure covering the transparent display area, the filter is located on the encapsulation structure;

wherein each of the transparent unit further comprises a first light enhancement unit disposed on the encapsulation structure, the first light enhancement unit is located directly above the transparent laminate and spaced apart from the filter.

According to one aspect of the invention, wherein each of the transparent laminates has an opening directly exposing the substrate.

According to one aspect of the invention, wherein each of the openings has a second light enhancement unit filling the opening.

According to one aspect of the invention, wherein the first light enhancement unit and the second light enhancement unit are inorganic substances or organic small molecules having a microcavity structure.

According to one aspect of the invention, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a white light emitting layer and a red color film layer located above the white light emitting layer;

wherein the blue light emitting structure comprises a white light emitting layer and a blue color film layer located above the white light emitting layer;

wherein the green light emitting structure comprises a white light emitting layer and a green color film layer located above the white light emitting layer.

According to one aspect of the invention, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a red light emitting layer;

wherein the blue light emitting structure comprises a blue light emitting layer;

wherein the green light emitting structure comprises a green light emitting layer.

The present invention further provides an organic light emitting diode (OLED) display panel, wherein the display panel comprises a substrate and a transparent display area disposed on the substrate, the transparent display area comprises a plurality of pixel units and a plurality of transparent units disposed at intervals;

wherein each of the pixel units comprises a light emitting structure and a filter disposed on the light emitting structure, a color of a light retained by the filter is same as a color of a light emitted by the light emitting structure.

According to one aspect of the invention, wherein the light emitting structure comprises thin film transistors and a light emitting layer corresponding to the thin film transistors;

wherein each of the transparent units comprises a transparent laminate, the transparent laminate formed by extending transparent insulating layers in the light emitting structure adjacent to the transparent unit, the transparent insulating layers comprise insulating layers in the thin film transistor and the light emitting unit.

According to one aspect of the invention, wherein the display panel further comprises an encapsulation structure covering the transparent display area, the filter is located on the encapsulation structure;

wherein each of the transparent unit further comprises a first light enhancement unit disposed on the encapsulation structure, the first light enhancement unit is located directly above the transparent laminate and spaced apart from the filter.

According to one aspect of the invention, wherein each of the transparent laminates has an opening directly exposing the substrate.

According to one aspect of the invention, wherein each of the openings has a second light enhancement unit filling the opening.

According to one aspect of the invention, wherein the first light enhancement unit and the second light enhancement unit are inorganic substances or organic small molecules having a microcavity structure.

According to one aspect of the invention, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a white light emitting layer and a red color film layer located above the white light emitting layer;

wherein the blue light emitting structure comprises a white light emitting layer and a blue color film layer located above the white light emitting layer;

wherein the green light emitting structure comprises a white light emitting layer and a green color film layer located above the white light emitting layer.

According to one aspect of the invention, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a red light emitting layer;

wherein the blue light emitting structure comprises a blue light emitting layer;

wherein the green light emitting structure comprises a green light emitting layer.

The present invention further provides an electronic device, wherein the electronic device comprises an organic light emitting diode (OLED) display panel and a light sensing unit disposed under the OLED display panel, the display panel comprises a substrate and a transparent display area disposed on the substrate, the transparent display area comprises a plurality of pixel units and a plurality of transparent units disposed at intervals;

wherein each of the pixel units comprises a light emitting structure and a filter disposed on the light emitting structure, a color of a light retained by the filter is same as a color of a light emitted by the light emitting structure.

According to one aspect of the invention, wherein the light sensing unit comprises a camera.

Beneficial Effects

The present invention provides an OLED display panel, the pixel unit in the light transparent display area of the panel includes a filter disposed on the light emitting structure, and a color of a light retained by the filter is same as a color of a light emitted by the light emitting structure. Therefore, the light went into the display panel can be changed to a reflected light having the same color as the light emitting unit by the filter. The reflected light is emitted together with the light emitted by the light emitting unit, thereby eliminating the reflection of the natural light by the display panel. Because the light transparent effect of the filter is much better than the polarizer, the present invention greatly improves the light transparent effect of the display panel.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
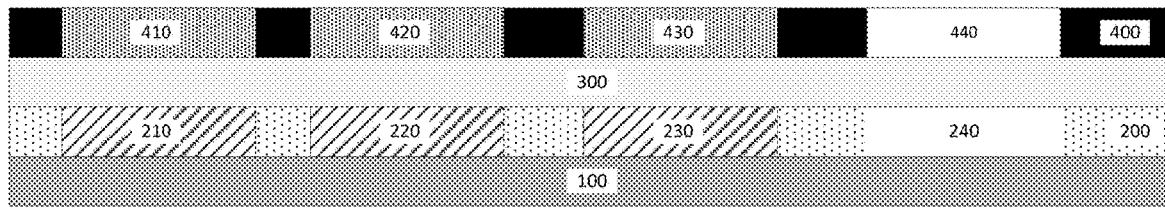
FIG. 1 is a structural diagram of a transparent display area of an OLED display panel according to an embodiment of the present invention.
Figure 2:
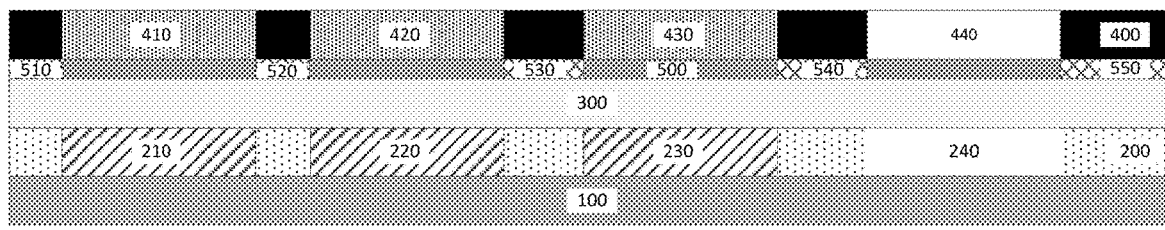
FIG. 2 is a structural diagram of a transparent display area of an OLED display panel according to another embodiment of the present invention.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

As described above, polarizers are used in the prior art to eliminate the light reflected by the metal layer of the display panel. Because the light transparent effect of the polarizers is less than 50%, the light transparent effect of the display panel is seriously reduced. For electronic devices with built-in off-screen light sensors, the low transparent effect of the display panel can seriously affect the operation of the light sensors and even make it inoperable.

The present invention provides an organic light emitting diode (OLED) display panel and an electronic device, which can reduce the light transparent of the display panel while reducing the reflection of the display panel.

The present invention will be described in detail in conjunction with the drawings and specific embodiments.

As shown in FIG. 1, FIG. 1 is a structural diagram of a transparent display area of an OLED display panel according to an embodiment of the present invention. In the present embodiment, the display panel includes a substrate 100 and a transparent display area disposed on the substrate 100, the transparent display area comprises a plurality of pixel units and a plurality of transparent units disposed at intervals. Each of the pixel units comprises a light emitting structure and a filter disposed on the light emitting structure, a color of a light retained by the filter is same as a color of a light emitted by the light emitting structure.

In the present embodiment, wherein the light emitting structure comprises thin film transistors and a light emitting layer corresponding to the thin film transistors. The thin film transistor includes a plurality of insulating layers for electrically isolating, such as a gate dielectric layer, an interlayer dielectric layer, and a planarization layer. The light emitting layer includes a pixel defining layer for defining a light emitting region, and the pixel defining layer is made of an insulating material such as silicon oxide, silicon nitride or the like. Each of the transparent units comprises a transparent laminate, the transparent laminate formed by extending transparent insulating layers in the light emitting structure adjacent to the transparent unit, the transparent insulating layers comprise insulating layers in the thin film transistor and the light emitting unit.

Figure 4:
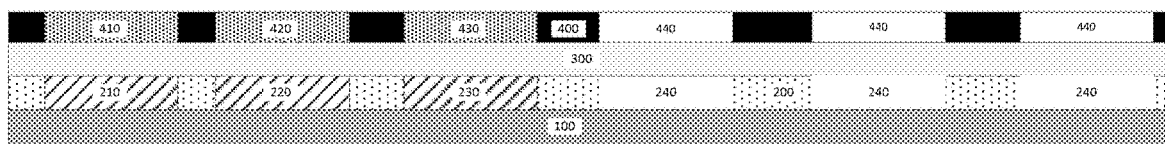
FIG. 4 is a structural diagram of a transparent display area of an OLED display panel in a third embodiment of the present invention.
Figure 5:
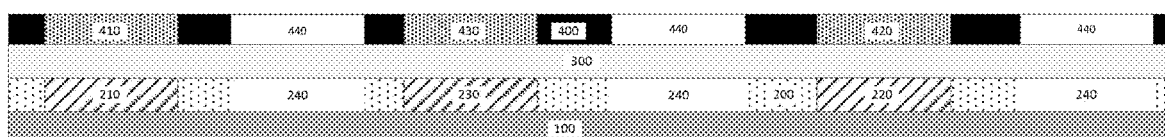
FIG. 5 is a structural diagram of a transparent display area of an OLED display panel in a fourth embodiment of the present invention.

Preferably, a ratio of a number of pixel units in the transparent display area to a number of transparent units is 3:1 to 1:1. Referring to FIG. 1, the ratio of the number of pixel units in the transparent display area to the number of transparent units in FIG. 1 is 3:1. Referring to FIG. 4, the ratio of the number of pixel units of the transparent display area to the number of transparent units in FIG. 4 is 3:3. Referring to FIG. 5, the ratio of the number of pixel units in the transparent display area to the number of transparent units in FIG. 5 is also 1:1. In practice, the pixel units and the transparent units can adopt different arrangements according to requirements, and the arrangements are not limited to the arrangements disclosed in the present embodiment. The technical solutions formed by changing the number and arrangement of the pixel units and the transparent units also fall within the protection scope of the present invention.

Figure 3:
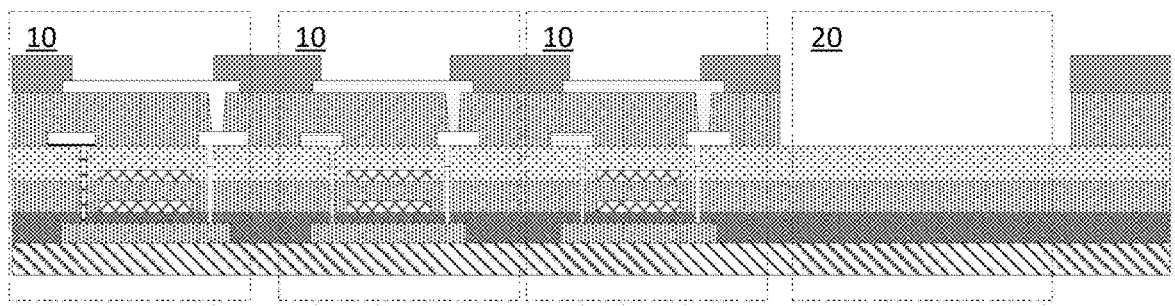
FIG. 3 is a structural diagram of a thin film transistor layer under the transparent display area of an OLED display panel according to an embodiment of the present invention.

Preferably, the substrate 100 includes a thin film transistor layer. Referring to FIG. 3, the thin film transistor layer includes thin film transistor units 10 and metal avoidance regions 20. The thin film transistor unit 10 corresponds to a pixel unit in the transparent display area, the metal avoidance regions 20 correspond to a transparent unit in the transparent display area. The metal avoidance region 20 constitutes the transparent laminate.

In this embodiment, the plurality of pixel units includes a plurality of red pixel units, a plurality of green pixel units, and a plurality of blue pixel units. The red pixel units in FIG. 1 includes a red light emitting structure 210, the green pixel unit including a green light emitting structure 220, and the blue pixel unit includes a blue light emitting structure 230. The plurality of red light emitting structures 210, the plurality of green light emitting structures 220, and the plurality of blue light emitting structures 230 are spaced apart by the pixel defining layer 200. The material forming the pixel defining layer 200 is a transparent insulating material.

Multiple filters corresponding to the light emitting structures are: a red color filter 410 disposed above the red light emitting structure 210, a green filter 420 dispose above the green light emitting structure 220, and a blue color filter 430 disposed above the blue light emitting structure 230. A plurality of the plurality of filters are spaced apart by the isolation r layer 400, and the material constituting the isolation layer 400 is a black light-shielding material such as a black resin. The isolation layer 400 is used to avoid natural light from entering the display panel and reducing reflection of ambient light. In practice, the pixel units and the transparent units can adopt different arrangements according to requirements, and the arrangements are not limited to the arrangements disclosed in the embodiment. The technical solutions formed by changing the number and arrangement of the pixel units and the transparent units also fall into the protection scope of the present invention.

Preferably, an encapsulation structure 300 is disposed between the transparent structure and the isolation layer 400. The encapsulation structure 300 is used to protect the transparent structure of the display panel from being corroded by water and oxygen. Preferably, the encapsulation structure 300 is a thin film encapsulation structure including a laminate structure composed of at least one organic film and at least one inorganic film.

Preferably, the display panel further includes a touch layer 500 disposed between the encapsulation structure 300 and the isolation layer 400. The touch layer 500 includes a plurality of touch units and a plurality of insulating regions that isolate the touch units. In this embodiment, the touch units include a first touch unit 510, a second touch unit 520, a third touch unit 530, a fourth touch unit 540, and a fifth touch unit 550. The touch units are located directly below the isolation layer 400. Each of the touch units includes at least a first touch electrode, an insulating layer, a second touch electrode, and a bridge structure.

Specifically, each of the pixel units can be composed of a white light emitting layer and a color film structure with a corresponding color. For example, the red light emitting structure 210 includes a white light emitting layer and a red light color film layer above the white light emitting layer. The blue light emitting structure 220 includes a white light emitting layer and a blue color film layer above the white light emitting layer. The green light emitting structure 230 includes a white light emitting layer and a green light color film layer above the white light emitting layer. Optionally, each of the pixel units can also be composed of a light emitting structure of a corresponding color. For example, the red light emitting structure 210 includes a red light emitting layer, the blue light emitting structure 220 includes a blue light emitting layer, and the green light emitting structure 230 includes a green light emitting layer.

Preferably, in the present embodiment, the transparent unit 240 is a transparent laminate composed of a transparent material. The transparent laminate can be a laminate of silicon oxide, aluminum oxide or a transparent organic material. Preferably, the transparent laminate has the same material as the pixel defining layer in the transparent unit 240 and formed in a same deposition process.

Preferably, in the present embodiment, the transparent unit 240 further includes a first light enhancement unit 440 above the transparent laminate. The first light enhancement unit is located directly above the transparent laminate and spaced apart from the filters. The material of the first light enhancement unit is an inorganic or organic small molecule.

The inorganic or organic small molecules can change the optical structure of the device and adjust its microcavity effect, thereby improving the transparent effect of the transparent unit 240. The inorganic molecule can be zinc selenide (ZnSe), and the organic small molecule may be n-bromopropane (NPB) or other aromatic amine-based organic matter.

Preferably, in the present embodiment, in order to further improve the transparent effect of the transparent unit 240, the transparent unit 240 has an opening directly exposing the substrate 100. That is, the transparent laminate forming the transparent unit 240 is removed by photolithography to prevent light from being absorbed and lost, and to improve transparent effect. Further, in this embodiment, the opening has a second light enhancement unit filling in the opening. Like the first light enhancement unit, the material of the second light enhancement unit is an inorganic or organic small molecule. The inorganic or organic small molecules can change the optical structure of the device and adjust its microcavity effect, thereby improving the transparent effect of the transparent unit 240. The inorganic molecule can be zinc selenide (ZnSe), and the organic small molecule may be n-bromopropane (NPB) or other aromatic amine-based organic matter.

The present invention further provides an electronic device, wherein the electronic device comprises the OLED display panel and a light sensing unit disposed under the OLED display pane. The display panel comprises a substrate 100 and a transparent display area disposed on the substrate 100, the transparent display area comprises a plurality of pixel units and a plurality of transparent units disposed at intervals. Each of the pixel units comprises a light emitting structure and a filter disposed on the light emitting structure, a color of a light retained by the filter is same as a color of a light emitted by the light emitting structure.

Preferably, in the present embodiment, the light sensing unit comprises a camera. Of course, the light sensing unit can also be a screen fingerprint recognition unit or other light sensor.

The present invention provides an OLED display panel, the pixel unit in the light transparent display area of the panel includes a filter disposed on the light emitting structure, and a color of a light retained by the filter is same as a color of a light emitted by the light emitting structure. Therefore, the light went into the display panel can be changed to a reflected light having the same color as the light emitting unit by the filter. The reflected light is emitted together with the light emitted by the light emitting unit, thereby eliminating the reflection of the natural light by the display panel. Because the light transparent effect of the filter is much better than the polarizer, the present invention greatly improves the light transparent effect of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:
1. An organic light emitting diode (OLED) display panel, wherein the OLED display panel comprises a substrate and a transparent display area disposed on the substrate, the transparent display area comprises a plurality of pixel units and a plurality of transparent units disposed at intervals;
   wherein each of the plurality of pixel units comprises a light emitting structure and a filter disposed on the light emitting structure, a color of a light retained by the filter is same as a color of a light emitted by the light emitting structure;
   wherein the light emitting structure of each of the plurality of pixel units comprises thin film transistors and a light emitting layer corresponding to the thin film transistors, wherein the light emitting layer includes a pixel defining layer, wherein the pixel defining layer comprises a first transparent insulating material;
   wherein the light emitting structure of each of the plurality of pixel units are spaced apart by the pixel defining layer;
   wherein each of the plurality of transparent units comprises a transparent laminate,
   wherein, the transparent laminate is formed by extending at least two transparent insulating layers in the light emitting structure adjacent to each of the plurality of transparent units, wherein the at least two transparent insulating layers comprise insulating layers in the thin film transistors and the pixel defining layer;
   wherein the OLED display panel further comprises an encapsulation structure covering the transparent display area, the filter is located on the encapsulation structure;
   wherein each of the plurality of transparent units further comprises a first light enhancement unit disposed on the encapsulation structure, the first light enhancement unit is located directly above the transparent laminate and spaced apart from the filter, and the first light enhancement unit comprises inorganic substances or organic small molecules having a microcavity structure.

2. The display panel according to claim 1, wherein the pixel units comprise a plurality of red pixel units, a plurality of green pixel units, and a plurality of blue pixel units;
   wherein each of the red pixel unit comprises a red light emitting structure, each of the green pixel units comprises a green light emitting structure, and each of the blue pixel units comprises a blue light emitting structure;
   wherein the red light emitting structure comprises a white light emitting layer and a red color film layer located above the white light emitting layer;
   wherein the blue light emitting structure comprises a white light emitting layer and a blue color film layer located above the white light emitting layer;
   wherein the green light emitting structure comprises a white light emitting layer and a green color film layer located above the white light emitting layer.

3. The display panel according to claim 1, wherein the pixel units comprise a plurality of red pixel units, a plurality of green pixel units, and a plurality of blue pixel units;
   wherein each of the red pixel unit comprises a red light emitting structure, each of the green pixel units comprises a green light emitting structure, and each of the blue pixel units comprises a blue light emitting structure;
   wherein the red light emitting structure comprises a red light emitting layer;
   wherein the blue light emitting structure comprises a blue light emitting layer;
   wherein the green light emitting structure comprises a green light emitting layer.

4. An organic light emitting diode (OLED) display panel, wherein the OLED display panel comprises a substrate and a transparent display area disposed on the substrate, the transparent display area comprises a plurality of pixel units and a plurality of transparent units disposed at intervals;

wherein each of the plurality of pixel units comprises a light emitting structure and a filter disposed on the light emitting structure, a color of a light retained by the filter is same as a color of a light emitted by the light emitting structure, wherein the light emitting structures of each of the plurality of pixel units comprise thin film transistors and a light emitting layer, wherein the light emitting layer includes a pixel defining layer, wherein the pixel defining layer comprises a first transparent insulating material;

wherein the light emitting structures of each of the plurality of pixel units are spaced apart by the pixel defining layer;

wherein each of the plurality of transparent units comprises a transparent laminate, wherein, the transparent laminate is formed by extending at least two transparent insulating layers in the light emitting structure adjacent to each of the plurality of transparent units, wherein the at least two transparent insulating layers comprise insulating layers in the thin film transistors and the pixel defining layer;

wherein each of the plurality of transparent units further comprises a first light enhancement unit, the first light enhancement unit is located directly above the transparent laminate and spaced apart from the filter, and the first light enhancement unit comprises inorganic substances or organic small molecules having a microcavity structure.

5. The display panel according to claim 4, wherein the light emitting layer is corresponding to the thin film transistors.

6. The display panel according to claim 5, wherein the display panel further comprises an encapsulation structure covering the transparent display area, the filter is located on the encapsulation structure wherein the first light enhancement unit is disposed on the encapsulation structure.

7. The display panel according to claim 4, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a white light emitting layer and a red color film layer located above the white light emitting layer;

wherein the blue light emitting structure comprises a white light emitting layer and a blue color film layer located above the white light emitting layer;

wherein the green light emitting structure comprises a white light emitting layer and a green color film layer located above the white light emitting layer.

8. The display panel according to claim 4, wherein the pixel units comprise a plurality of red pixel units, a plurality of green pixel units, and a plurality of blue pixel units;

wherein each of the red pixel unit comprises a red light emitting structure, each of the green pixel units comprises a green light emitting structure, and each of the blue pixel units comprises a blue light emitting structure;

wherein the red light emitting structure comprises a red light emitting layer;

wherein the blue light emitting structure comprises a blue light emitting layer;

wherein the green light emitting structure comprises a green light emitting layer.

9. An electronic device, wherein the electronic device comprises an organic light emitting diode (OLED) display panel and a light sensing unit disposed under the OLED display panel, the OLED display panel comprises a substrate and a transparent display area disposed on the substrate, the transparent display area comprises a plurality of pixel units and a plurality of transparent units disposed at intervals;

wherein each of the plurality of pixel units comprises a light emitting structure and a filter disposed on the light emitting structure, a color of a light retained by the filter is same as a color of a light emitted by the light emitting structure;

wherein the light emitting structures of each of the plurality of pixel units comprise thin film transistors and a light emitting layer corresponding to the thin film transistors, wherein the light emitting layer includes a pixel defining layer, wherein the pixel defining layer comprises a first transparent insulating material;

wherein the light emitting structures of each of the plurality of pixel units are spaced apart by the pixel defining layer;

wherein each of the plurality of transparent units comprises a transparent laminate, wherein, the transparent laminate is formed by extending at least two transparent insulating layers in the light emitting structure adjacent to each of the plurality of transparent units, the at least two transparent insulating layers comprise insulating layers in the thin film transistors and the pixel defining layer;

wherein the OLED display panel further comprises an encapsulation structure covering the transparent display area, the filter is located on the encapsulation structure;

wherein each of the plurality of transparent units further comprises a first light enhancement unit disposed on the encapsulation structure, the first light enhancement unit is located directly above the transparent laminate and spaced apart from the filter, and the first light enhancement unit comprises inorganic substances or organic small molecules having a microcavity structure.

10. The electronic device according to claim 9, wherein the light sensing unit comprises a camera.

* * * * *